United States Patent [19]
Hill et al.

[11] Patent Number: 5,681,883
[45] Date of Patent: Oct. 28, 1997

[54] ENHANCED BORON NITRIDE COMPOSITION AND POLYMER BASED HIGH THERMAL CONDUCTIVITY MOLDING COMPOUND

[75] Inventors: Richard Frank Hill; Stephen Phillip DaVanzo, both of Chagrin Falls, Ohio

[73] Assignee: Advanced Ceramics Corporation, Lakewood, Ohio

[21] Appl. No.: 610,764

[22] Filed: Mar. 5, 1996

[51] Int. Cl.$^6$ .................... C08J 5/10; C08K 3/38; C08L 63/04
[52] U.S. Cl. .................... 524/404; 524/322; 523/445
[58] Field of Search ........................ 524/404, 322; 523/445

[56] References Cited

U.S. PATENT DOCUMENTS

| | | | |
|---|---|---|---|
| 5,011,872 | 4/1991 | Latham et al. | 523/440 |
| 5,498,659 | 3/1996 | Esser | 524/549 |

OTHER PUBLICATIONS

Improved Thermal Conductivity in Microelectronic Encapsulants Philip Procter and Jitka Sole—IEEE Transactions on Components, Hybrids & Manufacturing Technology, vol. 14 No. 4, Dec. 1991—pp. 708–713.

Thermal Conductivity of Molding Compounds for Plastic Packaging—P. Bujard & G.Kahnlein—Ciba Geigy SA, 1994 IEEE—pp. 159–163.

Thermal & Influence of Sample Preparation—P.Bujard—Ciba Geigy Ltd, Research Center 1988 IEEE—pp. 41–49.

Primary Examiner—Paul R. Michl
Assistant Examiner—U. K. Rajguru
Attorney, Agent, or Firm—Eugene Lieberstein; Michael N. Meller

[57] ABSTRACT

The present invention relates to a boron nitride composition of particles of boron nitride and a nonionic surfactant for use as a filler with a distribution of agglomerates having an average particle size in the range of between 20–80 microns and to a molding compound having a high thermal conductivity of above at least 5 W/m° K. The molding compound comprises a polymer base material, a filler and a nonionic surfactant with the filler comprising boron nitride in a concentration of at least 60% by weight of said composition and wherein the nonionic surfactant is selected from the class consisting of carboxylic acid amides and carboxylic acid esters.

9 Claims, 6 Drawing Sheets

ENHANCED BORON NITRIDE COMPOSITION AND POLYMER BASED HIGH THERMAL CONDUCTIVITY MOLDING COMPOUND

FIELD OF THE INVENTION

The present invention relates to a boron nitride composition for use particularly in forming a high thermal conductivity molding compound and to a polymer based molding compound containing boron nitride.

BACKGROUND OF INVENTION

A molding compound is used in the semiconductor industry as a packaging material or as an encapsulant to protect semiconductor devices from physical, electrical, and environmental damage. For semiconductor applications the molding compound must possess properties of high electrical insulation. In cases where the semiconductor device generates heat at a relatively low level the molding compound may consist solely of an epoxy composition or of a composite of an epoxy resin formulation and filler. Epoxy resins are known to have high electrical insulation properties but possess very low thermal conductivity. For semiconductor devices that produce a great deal of heat a very high thermal conductivity encapsulant or package is mandatory. Currently, where very high thermal conductivity is required a package composed entirely of ceramic is used. However, ceramic packages are very expensive and require specialized processing. Therefore as semiconductor devices become more powerful and smaller in size the demand for a molding compound having much higher thermal conductivity than currently commercially available will substantially increase.

Commercially available molding compounds for use in plastic microelectronics packaging typically have thermal conductivity values in the range of 0.7W/m° K. Molding compounds with fillers optimized for thermal conductivity are available with thermal conductivities of 2 to 3 W/m° K. although in a literature article in the 1988 IEEE by Bujard entitled Thermal Conductivity of Boron Nitride filled Epoxy Resins:Temperature Dependence and Influence of Sample Preparation molding compound formulations are claimed to have been made up to 4.5 W/m° K.

Currently, fused silica is the predominant filler used in thermal molding compounds due to its low cost, low thermal expansion, and low electrical conductivity. It is known that boron nitride can be used as a filler and substituted for fused silica ($SiO_2$) to provide low thermal expansion and high electrical resistivity. Boron nitride should also substantially increase the thermal conductivity of a polymer-ceramic composite provided it is heavily loaded into the polymer-ceramic, i.e., the concentration of boron nitride in the base polymer composition is high. Stated otherwise, in order to get a higher thermal conductivity, high boron nitride filler loadings are required. Unfortunately a high loading of boron nitride has been found to substantially inhibit the "flow properties" of the composite. Flow is a necessary characteristic of the material for use as a filler in a conventional epoxy resin molding compound formulation, i.e., the mixture of materials must flow under conditions simulating those in conventional transfer molding processes. The standard test used by the industry to measure the flow properties of a composite molding compound is the "Spiral Flow Test" which measures the distance that the molding compound is able to move through a spiral flow canal in a spiral flow test mold using a transfer press under a given standard pressure and temperature conditions. The spiral flow measurement should be reasonably high and should compare to the spiral flow characteristic of that of standard commercially available epoxy molding compound formulations loaded with fused silica which is generally above 15 to 20 inches. Heretofore the maximum spiral flow measurement obtainable with an epoxy boron nitride composition having a boron nitride loading of 65% or over was about 5 inches. The use of boron nitride as a filler for other applications is also limited by the flow properties of the material composition containing the boron nitride filler.

SUMMARY OF THE INVENTION

It has been discovered in accordance with the present invention that boron nitride may be used to enhance the thermal conductivity of any polymer based molding compound so as to achieve thermal conductivities of above 5 W/m° K. and preferably in a range of at least 6 to 11.6 W/m° K. based upon the level of loading of boron nitride in the selected polymer base molding formulation without inhibiting the flow properties of the molding formulation. In fact it has been discovered that the flow properties of the polymer base molding formulation may be significantly increased to a spiral flow reading of at least 10 inches in accordance with the standard spiral flow test by the judicious addition of a predetermined nonionic surfactant. When the thermal conductivity is at a value of above 5 W/m° K. and between 6 to 11.6 W/m° K. or higher simple plastic packaging may be used to protect microelectronic chips instead of having to go to ceramic packaging. Alternatively high thermal conductivity packaging may be used in place of designs using heat removal fins, heat sinks and heat spreaders. In fact at such high a thermal conductivity the package itself can now be used as a conduit for heat removal from the silicon chip. Similar utilization of the enhanced boron nitride composition of the subject invention can be useful for all sorts of applications, such as liquid encapsulants, underfills, overfills, potting compounds, printed wiring boards, silicone rubber pads, adhesives, and engineering plastics, all of which have applications requiring high thermal conductivity.

It has also been further discovered in accordance with the present invention that when the boron nitride is in the form of particles having a predetermined distribution of particle sizes the flow properties and thermal conductivity of the boron nitride is increased.

Accordingly, a boron nitride composition has been discovered for use as a filler comprising a composition of particles of boron nitride and a nonionic surfactant selected from the class consisting of carboxylic acid amides and carboxylic acid esters. The boron nitride particles should preferably have a distribution of agglomerates having an average particle size in the range of between 20–80 microns.

The present invention also relates to a molding compound having a high thermal conductivity of above at least 5 W/m° K. comprising a polymer base material, a filler, and a nonionic surfactant with the filler comprising boron nitride in a concentration of at least 60% by weight of said composition and wherein said surfactant is selected from the class consisting of carboxylic acid amides and carboxylic acid esters.

BRIEF DESCRIPTION OF THE DRAWINGS

The advantages of the present invention will become apparent from the following detailed description of the present invention when read in conjunction with the accompanying drawings of which.

DETAILED DESCRIPTION OF THE INVENTION

In order to form a molding compound a combination of filler and polymer are combined and mixed in a standard process including the steps of ball milling, hot roll milling and transfer molding. Any polymer base material may be used such as, for example, a polyimide, epoxy, cyanate ester or polyester. Epoxy formulations which are low in cost are currently preferred.

Step 1: Polymer Mix Preparation

A master batch of epoxy cresol novolak ("ECN") was prepared by mixing 300 grams of epoxy cresol novolak granules with 10 gms of carnuba wax by melting and mixing on a 2 roll mill at 105 ° C. This ECN mixture was cooled as a sheet and crushed by mortar and pestle. A master batch of Phenyl Novolak hardener ("PN") was prepared by blending 200 gms of PN with 4 grams of Triphenylphosphene catalyst.

Step 2: Ball Milling

The correct amount of BN filler powder, ECN master batch and PN master batch are weighed out and directly added to a ball mill. The total weight of the filler and polymer mix used in the ball mill was 100 grams with the ECN and PN master batch ratio at 3 to 2. The ball mill was then sealed tightly and placed on the large rolling mill for 1 hour. The material was then screened with a 5 mesh plastic screen which quickly separated the mill media from the powder mixture.

Step 3: Roll Milling

The ball milled BN powder-polymer mix Powder is added to the hot roll mill which is usually at 95°–105° C. and the powder mixture is mixed using the roll mill in a conventional fashion. After the polymer material wets out over the filler and is mixed thoroughly, the material is removed from the roll, cooled and broken up with a mortar and pestle into a granular like form. This material is now ready for the transfer molding process.

Step 4: Transfer Molding and Spiral Flow Testing

Approximately 20 grams of roll milled granular material were weighed out for each use of the spiral flow mold.

The testing procedure is as follows: the transfer press is prepared for testing by heating and controlling the temperature of the plates at 175° C. with the spiral flow mold clamped in place between the heated plates and the plunger touching the mold. The system is then allowed to reach equilibrium at the operating temperature. Next the plunger is opened, the machine set on auto, and the plates clamps are closed. The plunger pressure is set automatically to reach a pressure of 1000 psi in the transfer press pot and the clamp hydraulic pressure gage is set to register 2000 psi. The material is inserted quickly into the pot and immediately following insertion of the material, the ram is closed to apply the necessary pressure on the material.

The spiral flow of the material was recorded as the farthest point at which the material completely filled the spiral canal of the mold. Three runs were taken and the flow distances for each run were recorded.

Figure 1:
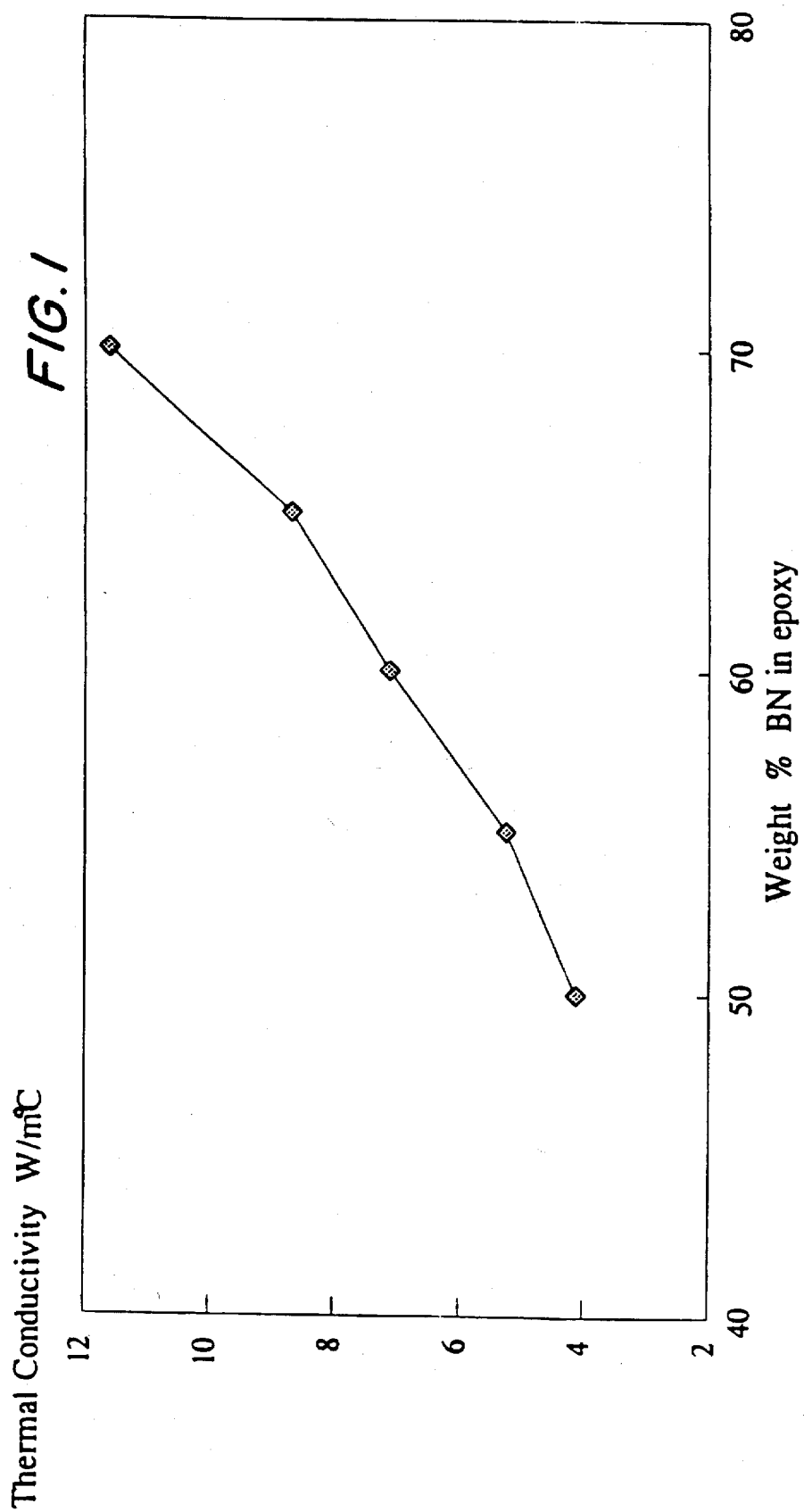
FIG. 1 is a graph showing the thermal conductivity characteristic of boron nitride in a conventional epoxy resin formulation based upon the content of boron nitride in weight percent.
Figure 2:
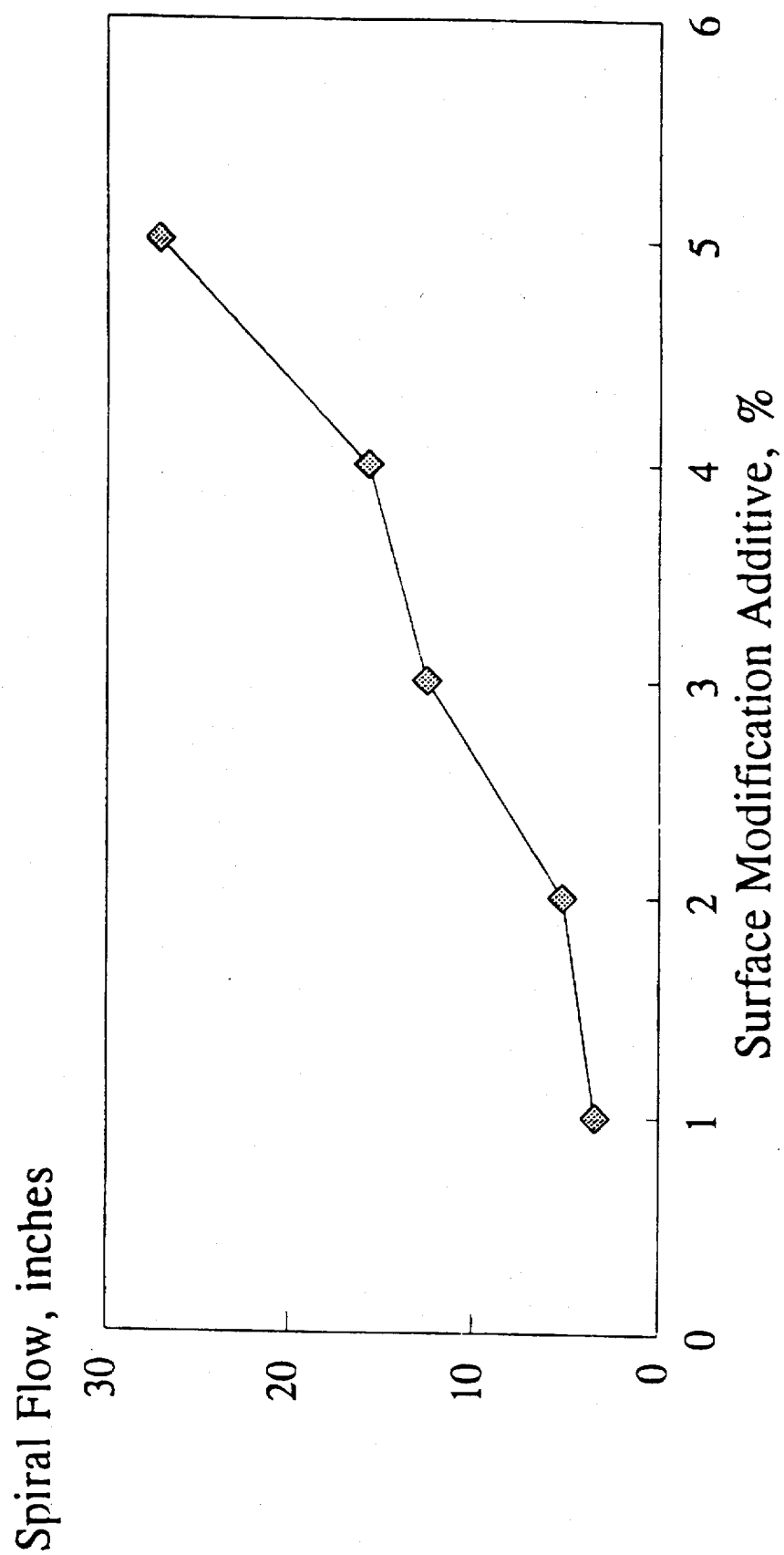
FIG. 2 is a graph showing the effectiveness of the addition of a nonionic surfactant to the boron nitride-polymer flow properties.

The benefit of using boron nitride as the filler is apparent from FIG. 1 which demonstrates the increase in thermal conductivity in a conventional epoxy molding composition with increased BN loading. FIG. 2 shows the added effectiveness of the addition of a nonionic surfactant to the flow properties of the molding compound. However as is shown in the following table 1, from which the points of FIG. 2 were taken, the addition of any surfactant becomes a detriment above a concentration of about 4.5% of the BN filler weight in that above this concentration the presence of the surfactant adversely affects the thermal conductivity of the composition causing it to drop. In deriving the data set forth in table 1 an ECN-PN transfer molding composition was loaded with 70 wt % boron nitride. A Sorbitan Monostearate surfactant was added into this composition at increments of 1 to 5 percent by weight of the BN to determine its effect on spiral flow and thermal conductivity.

TABLE 1

| Surfactant addition | 1% | 2% | 3% | 4% | 5% |
| --- | --- | --- | --- | --- | --- |
| Spiral Flow in inches | 3.4 | 5.2 | 10.5 | 15.7 | 27.1 |
| Thermal Cond. W/m° K | 6.07 | 7.25 | 9.68 | 11.6 | 10.6 |

From the above table 1 it is apparent that the benefit of a nonionic surfactant is cumulative to that realized from using a boron nitride filler within a narrow concentration range for the surfactant of between 1 to 4.5%. The increase in both flow properties and thermal conductivity using an ECN-PN transfer molding composition containing boron nitride and a surfactant additive are further demonstrated from the following Examples 1–4 as compared to examples without a surfactant additive. The typical properties of the Powder formulations for the following examples are shown below in Table 2:

TABLE 2

| TYPICAL POWDER PROPERTIES | | | |
| --- | --- | --- | --- |
| | Avg. Particle Size (microns) | Surface Area m²/g | −325 Mesh % |
| POWDER A | 9 | 5 | 99.9 |
| POWDER B | 60 | 1.5 | 15 |
| POWDER C | 20 | 3 | 99 |
| POWDER D | 45 | 2 | 50 |
| POWDER E | 10 | 2 | 99.9 |

EXAMPLE 1

A master batch of epoxy cresol novolak ("ECN") was prepared by mixing 300 grams of epoxy cresol novolok granules with 10 gms of carnuba wax by melting and mixing on a 2 roll mill at 105 ° C. This ECN mixture was cooled as a sheet and crushed by mortar and pestle. A master batch of Phenyl Novolak hardener ("PN") was prepared by blending 200 gms of PN with 4 grams of Triphenylphosphene catalyst. Hexagonal boron nitride powder ("Powder A") was coated with 2 wt % sorbitan monostearate by 1) dissolving sorbitan monostearate ("SM") in isopropyl alcohol, slurrying boron nitride in isopropyl alcohol with the SM, and stirring this mixture for 1 hour while heating to around 30° C., then further heating and stirring until most of the volatile compound is removed. The last volatiles are removed by drying at 100° C. A molding compound was made by adding 24 gms of ECN master batch, 16 gms of PN master batch, and 60 grams of sorbitan coated hexagonal boron nitride powder grade "Powder A" to a ball mill followed by milling for one hour. Next this blend was melted and mixed on a 2 roll mill, then removed from the mill in sheet form. The sheet was crushed in preparation for spiral flow testing. The crushed mix was added to the pot of a transfer press, and was pressed into a conventional "EMMI Spiral Flow Mold" made by the Hull Corporation at a temperature of 175° C. and a pot pressure of 1000 psi. The material flowed 9.5 inches (20669). In a separate test an additional 2 gms of SM was added to the ball mill in addition to the coated BN powder, PN, and ECN. The resulting flow was 29 inches. (20757). The same composition using uncoated Powder A, and adding 2 gms SM to the ball mill flowed 26.5 inches. (20756.1) The thermal conductivity of this sample was 6.8 W/m° C. The same process as described above was employed for the same composition without Sorbitan Monostearate coating or additive on the boron nitride powder. The resulting flow was 7.5 inches, (20820).

EXAMPLE 2

Figure 5:
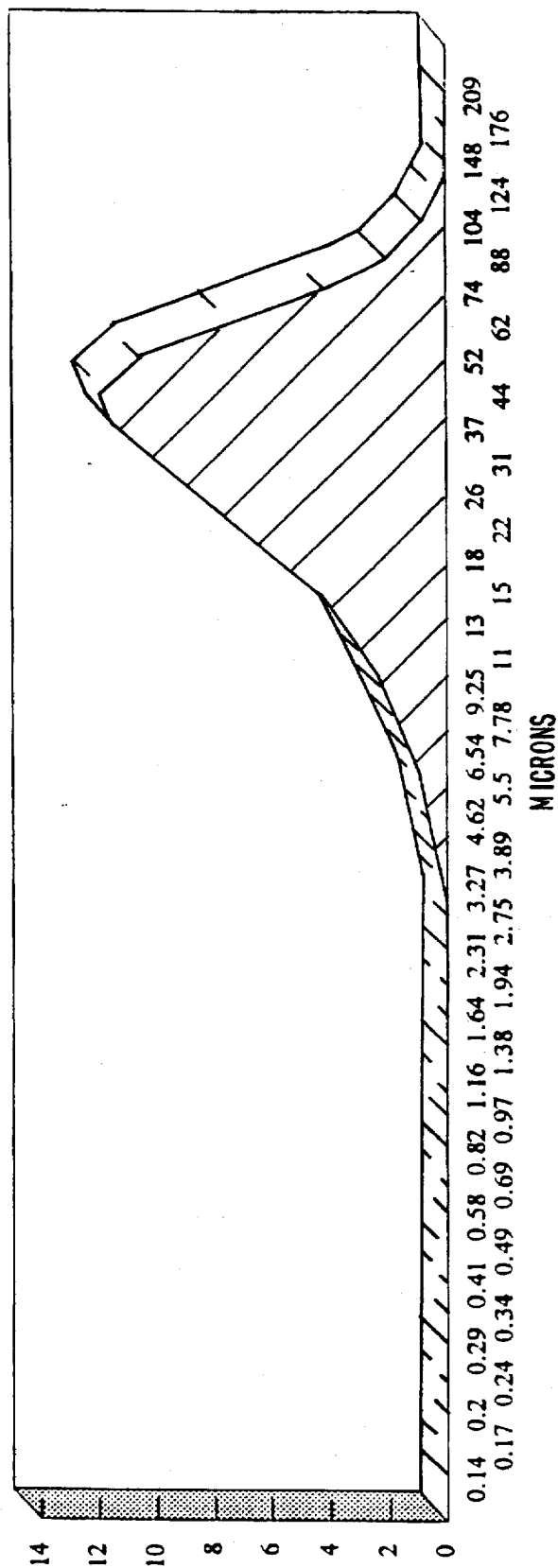
FIG. 5 shows the preferred particle size distribution curve for the boron nitride powder composition of the present invention and FIG. 6 shows a comparison particle size distribution curve for a boron nitride powder composition.

A formulation was prepared consisting of a mixture of 70 grams of BN powder ("Powder D") which was coated with SM, 18 grams of ECN master batch, and 12 grams of PN master batch. This preferred Powder D has a wide particle size distribution as is shown in FIG. 5 having an average particle size of preferably between 20–80 microns. The average particle size is determined using a laser technique particle size analyzer. This distribution consists primarily of dense BN agglomerates with relatively few superfine particles. The mix was ball milled, roll milled and transfer pressed into a spiral flow mold as described in example 1. The spiral flow was 7 inches, and the thermal conductivity was 6.91 W/m° C. (20826). The flow of the same composition, using uncoated powders was 5 inches (20822) and the material stuck to the mold. It had a Thermal Conductivity of 6.8 W/m° C. Further without the SM coating on the powders, but with adding 3% by weight of the filler as SM to the mix in the ball mill, the spiral flow was 13.5 inches, with a thermal conductivity of 11.6 W/m° C. (20831). Finally, using both coated powder and 3% of the filler by weight added as SM to the ball mill, the spiral flow was 28 inches, with a thermal conductivity of 8.2 W/m° C. (20832). The following data conforms to the previous two examples:

|  |  | Example 1 60% Filler | Example 2 70% Filler |
| --- | --- | --- | --- |
| BN Powder | Flow | 7.5 | 5 |
|  | T.C. |  | 6.8 |
| BN Powder coated with SM | Flow | 9.5 | 7 |
|  | T.C. |  | 6.9 |
| BN Powder + 3% SM | Flow | 26.5 | 13.5 |
|  | T.C. | 6.8 | 11.6 |
| BN Powder coated with SM + 3% SM | Flow | 29 | 28 |
|  | T.C. |  | 8.2 |

EXAMPLE 3

Powder Comparisons

Three percent SM was added to each of 5 BN powders followed by ball milling with the ECN-PN formulation identified in Example 1. The spiral flow was compared to that of the same powder without the SM additive. Results are tabulated below:

|  | Spiral Flow | Wt. % Filler | TC |
| --- | --- | --- | --- |
| Powder A (20850) | 3.1 | 65 | 4.2 |
| Powder A & 3% SM (20862.4) | 14.6 | 65 | 6.1 |
| Powder B (20836.1) | 5.5 | 65 |  |
| Powder B & 3% SM (20836.2) | 17.9 | 65 | 8.8 |
| Powder C (20840.1) | 3.8 | 65 |  |
| Powder C & 3% SM (20836.2) | 19.1 | 65 | 8.1 |
| Powder D (20904) | 6.0 | 65 |  |
| Powder D & 3% SM (20863.4) | 30.9 | 65 | 8.7 |
| Powder E (20839.1) | 4.1 | 65 |  |
| Powder E & 3% SM (20839.2) | 13.6 | 65 | 7.1 |

Figure 6:
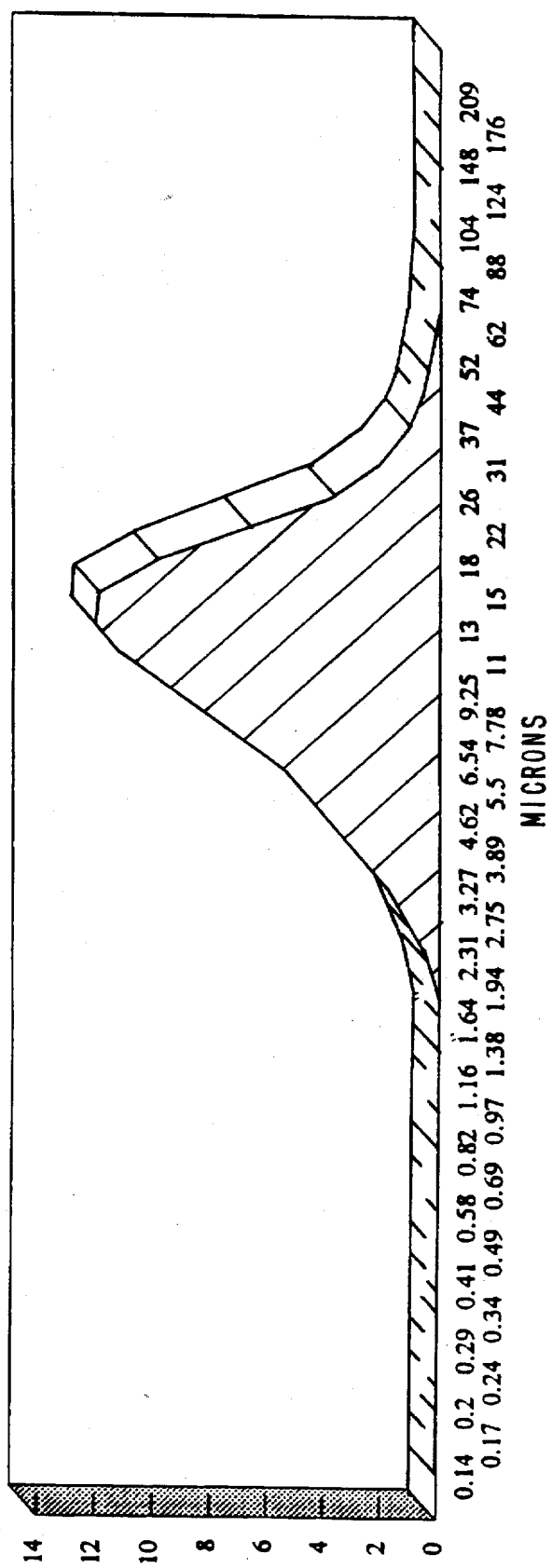

The size distribution of the particles also affects spiral flow with the particle size distribution of Powder D as shown in FIG. 5 with its average size in a range of between 20–80 microns. When the average particle size of the composition is relatively high i.e. above 20 microns higher flow levels are favored as well as higher thermal conductivity as compared to when the distribution of the particles has an average particle size substantially below 20 microns as e.g. Powder A as shown in FIG. 6 in which the average particle size is only about 10 microns because of the substantial number of superfine particles and an absence of any agglomerates above 15–20 microns.

EXAMPLE 1V

Figure 3:
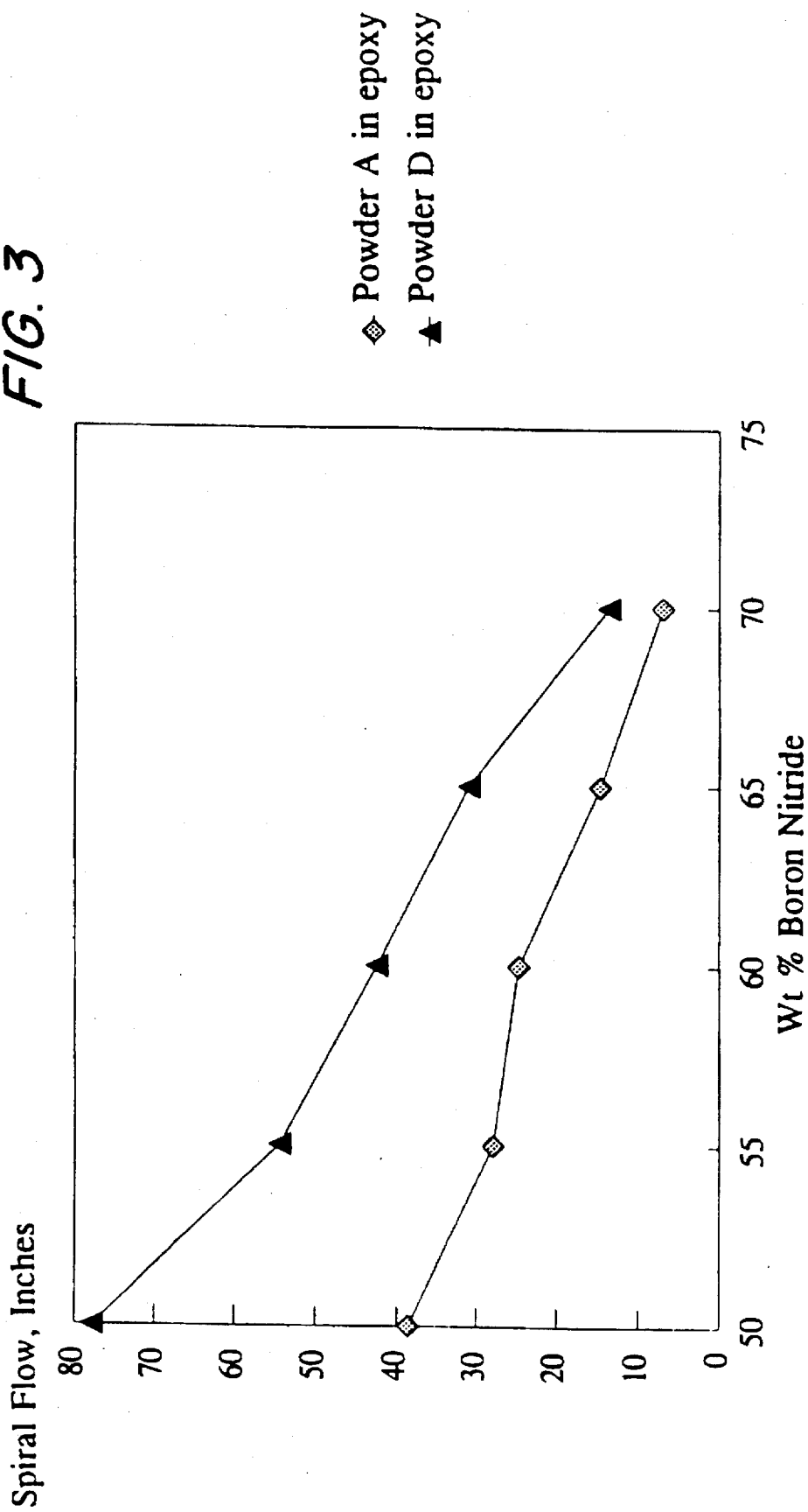
FIG. 3 is a graph showing the effect on spiral flow as a function of the concentration of boron nitride filler for two different molding compounds.
Figure 4:
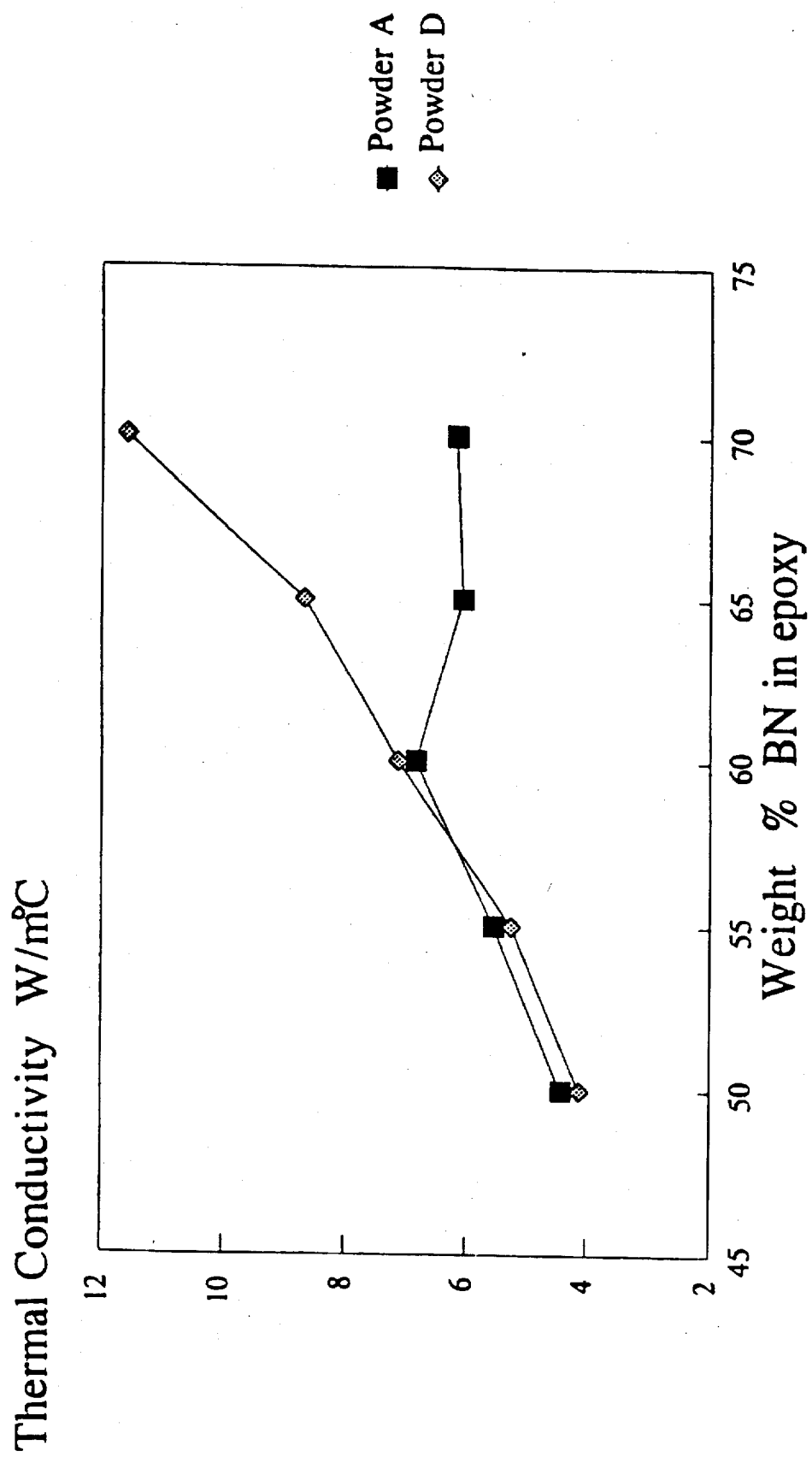
FIG. 4 is a graph showing the effect of thermal conductivity as a function of increased boron nitride filler concentration in the two molding compounds of FIG. 3.

Spiral flow and thermal conductivity were measured for Powder A and Powder D using the same composition as identified in Example I with 3% SM by varying the BN content. The results are shown in FIG. 3. Spiral flow for Powder D is much higher than for Powder A at the same loading level.

What we claim is:

1. A high thermal conductivity molding composition having a spiral flow of above 10 inches and a thermal conductivity of above 5 W/m° K. comprising a polymer base matrix, a boron nitride filler in a concentration of above 60% by weight and an additive consisting of a nonionic surfactant selected from the class consisting of carboxylic acid amides and carboxylic acid esters in a concentration of above at least 1% by weight.

2. A high thermal conductivity molding composition as defined in claim 1 wherein said additive is sorbitan monostearate.

3. A high thermal conductivity molding composition as defined in claim 2 wherein said polymer base matrix comprises an epoxy resin formulation of an epoxy cresol novolak and phenyl novolak.

4. A high thermal conductivity molding composition as defined in claim 3 wherein said additive lies in a range of between 1–4.5% by weight.

5. A high thermal conductivity molding composition as defined in claim 1 wherein said boron nitride filler is in a particulate form having an average particle size of between 20–80 microns.

6. A boron nitride composition for use as a filler consisting essentially of boron nitride and a nonionic surfactant selected from the class consisting of carboxylic acid amides and carboxylic acid esters.

7. A boron nitride composition as defined in claim 6 further comprising a polymer matrix with said polymer matrix consisting of epoxy cresol novolak and phenyl novolak and with the concentration of said surfactant in a range of between 1–4.5% by weight.

8. A boron nitride composition as defined in claim 6 further comprising a boron nitride powder with an average particle size of 20–80 microns.

9. A boron nitride composition as defined in claim 6 further comprising a boron nitride powder with an average particle size of 1–20 microns.

* * * * *